United States Patent [19]
Offner

[11] 4,293,186
[45] Oct. 6, 1981

[54] RESTRICTED OFF-AXIS FIELD OPTICAL SYSTEM

[75] Inventor: Abe Offner, Darien, Conn.

[73] Assignee: The Perkin-Elmer Corporation, Norwalk, Conn.

[21] Appl. No.: 106,415

[22] Filed: Dec. 21, 1979

Related U.S. Application Data

[63] Continuation-in-part of Ser. No. 938,569, Aug. 31, 1978, abandoned, which is a continuation-in-part of Ser. No. 767,906, Feb. 11, 1977, abandoned.

[51] Int. Cl.$^3$ .............................................. G02B 17/08
[52] U.S. Cl. .................................... 350/27; 350/432; 350/443; 350/444
[58] Field of Search .................. 350/27, 55, 432, 442, 350/443, 444, 445, 294

[56] References Cited

U.S. PATENT DOCUMENTS

| | | | |
|---|---|---|---|
| 3,244,073 | 4/1966 | Bowers | 350/294 |
| 3,748,015 | 7/1973 | Offner | 350/55 |
| 3,821,763 | 6/1974 | Scott | 350/206 |
| 3,951,546 | 4/1976 | Markle | 350/55 |
| 4,011,011 | 3/1977 | Hemstreet | 355/18 |

FOREIGN PATENT DOCUMENTS 784063 4/1935 France .
126911 3/1959 U.S.S.R. .

OTHER PUBLICATIONS

Makustov, D. D., "New Catadioptric Meniscus Systems", JOSA 34:5, May 1944, pp. 270–284.
Bouwers, A., "Achievements in Optics", Elsevier Publishing, 1946, pp. 24, 25, 39.

*Primary Examiner*—Conrad J. Clark
*Attorney, Agent, or Firm*—S. A. Giarratana; F. L. Masselle; E. T. Grimes

[57] ABSTRACT

This invention provides, in a restricted off-axis field optical system having a broad spectral range, which includes refracting elements, the improvement comprising:

an optical system constructed and arranged so that the Petzval sum is substantially zero, said refracting elements including elements for balancing the effects of the variation in the Petzval sum due to variation in color by introducing axial chromatic aberration of the opposite sense so that the position of focus at the off-axis field remains substantially constant;

according to the invention in one form thereof, the elements for balancing the effects of the variation in the Petzval sum due to variation in color include a symmetrically disposed nearly concentric meniscus element whose convex radius is larger than its concave radius and whose thickness is greater than the difference between its convex and concave radii;

further, according to a form of the invention, the system includes at least one convex and one concave mirror, said mirrors being nearly concentrically arranged along an optical axis;

further, according to one form thereof, the system includes a color trimming element;

the invention according to a form thereof, includes an optical system having a first half and a second half, each half including an optical system having an optical axis and having conjugate planes substantially normal to that axis, the first half and the second half being coaxially disposed in back-to-back relationship so that the conjugate planes are superimposed on at least one side of the optical system, and provision is made for spacing the object and final image locations on the other side of the optical system.

66 Claims, 12 Drawing Figures

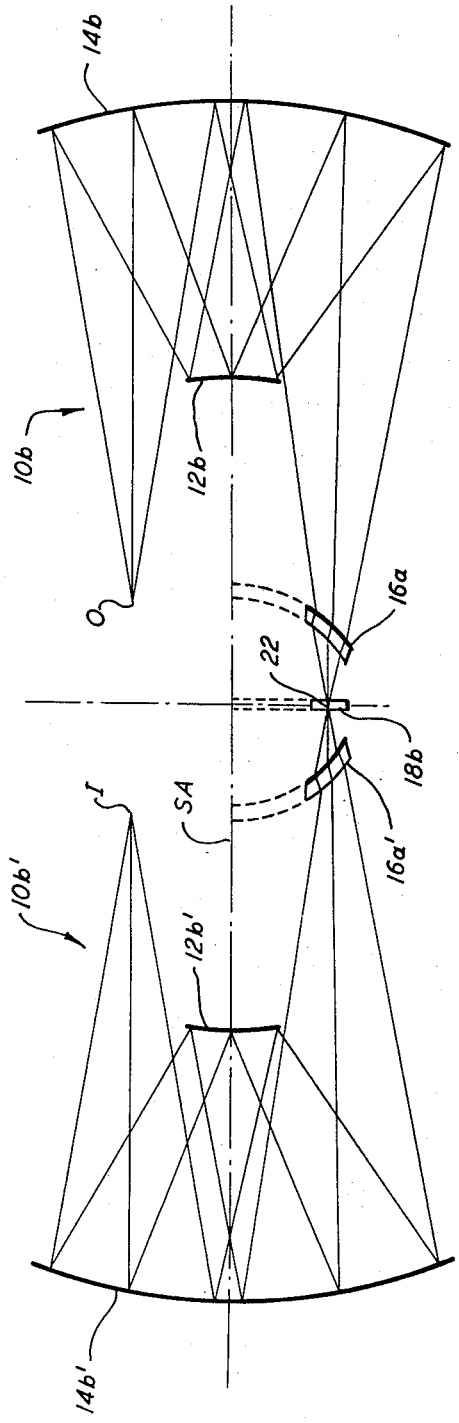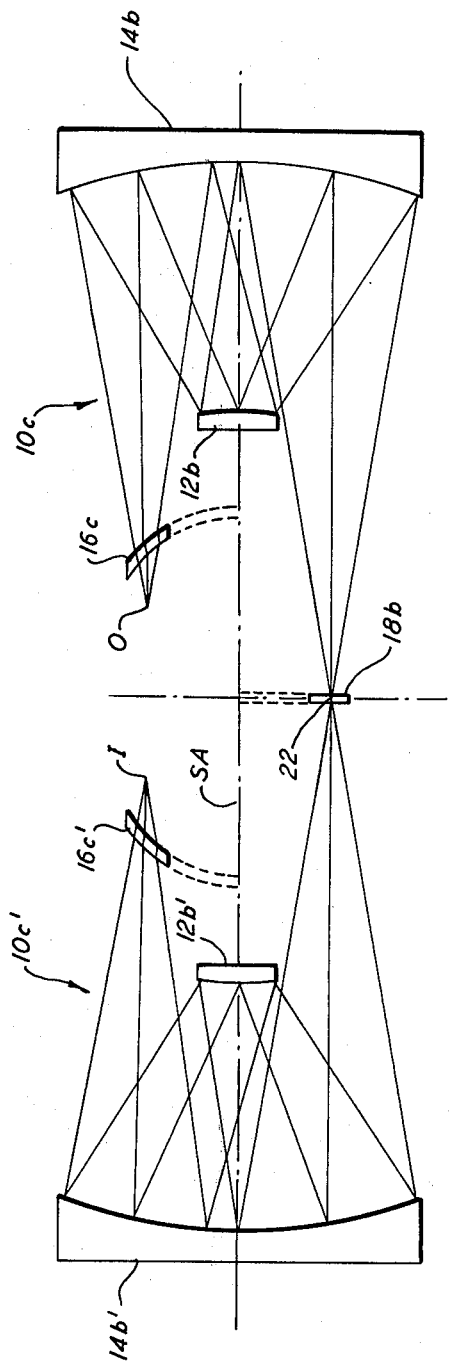

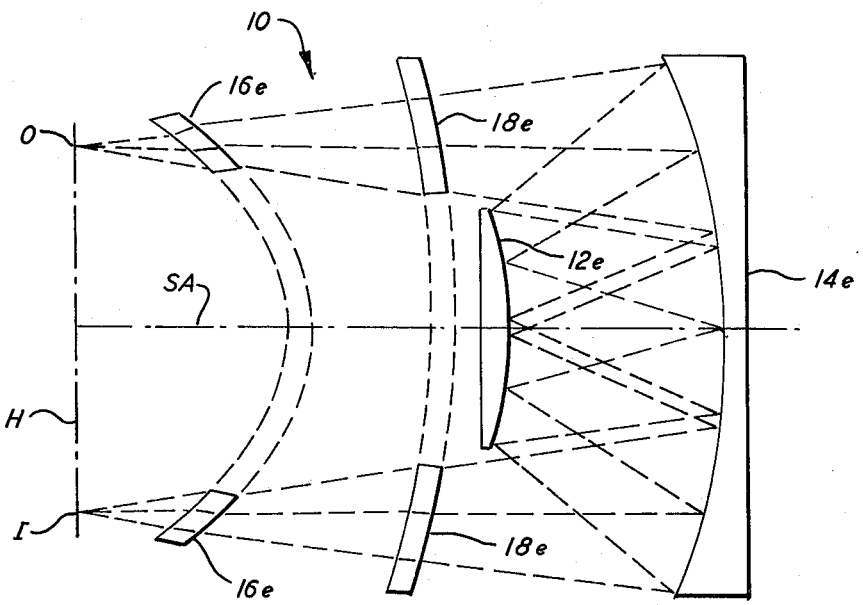
FIG. 8
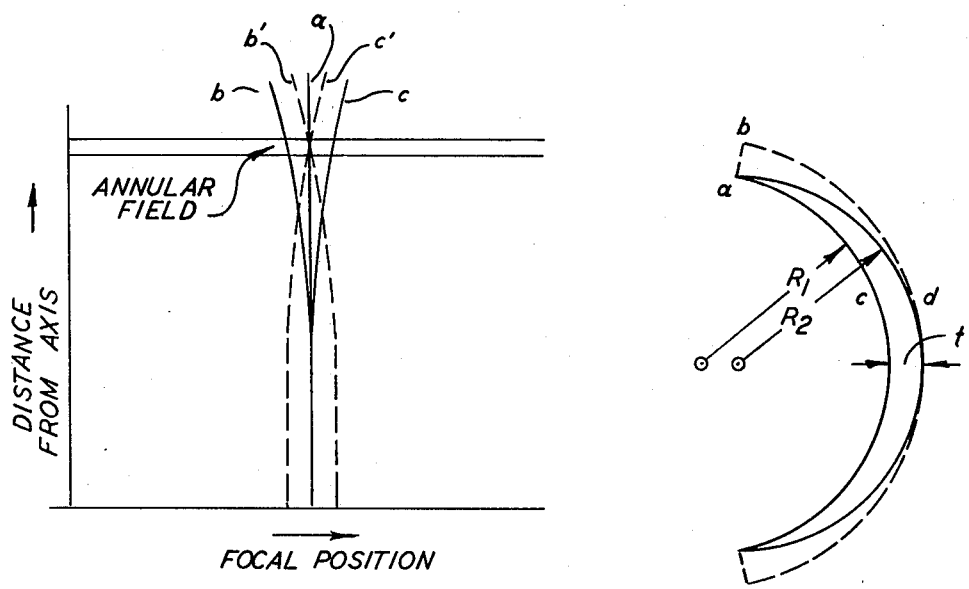
a = MEAN WAVELENGTH
b (b') = LONG WAVELENGTH
c (c') = SHORT WAVELENGTH
FIG. 9a
FIG. 9b

RESTRICTED OFF-AXIS FIELD OPTICAL SYSTEM

This application is a continuation-in-part of my copending application Ser. No. 938,569, filed Aug. 31, 1978, now abandoned, which, in turn, is a continuation-in-part of my application Ser. No. 767,906, filed Feb. 11, 1977, now abandoned.

BACKGROUND OF THE INVENTION

This invention relates to restricted off-axis field optical systems and, more particularly, to such a system having a large spectral range. Optical systems constructed in accordance with the concepts of this invention are particularly adapted, among many other possible uses, for effecting the exposure of photoresist-coated semi-conductor wafers in the manufacture of integrated circuits.

The present invention is related to the optical system disclosed by R. M. Scott in U.S. Pat. No. 3,821,763, and to the projection system disclosed in my U.S. Pat. No. 3,748,015 both of which are assigned to the assignee of the instant application, and the disclosures of which are incorporated by reference herein. The Scott patent discloses a restricted off-axis field optical system in which an annular slit is used to restrict the field to an annular zone centered on the optical axis and the system optically corrected to preferentially increase image quality in the annular zone. My prior patent discloses a catoptric, off-axis annular field optical system for forming in accurate micro detail an image of an object at unit magnification with high resolution including convex and concave mirrors in face-to-face relationship with their centers of curvature being substantially concentric. The mirrors are arranged to produce at least three reflections within the system, and they are used in the system with their axial conjugates at unit magnification in planes normal to the axis of the system, the axis containing the centers of curvature. While this optical system has many features and advantages, the present invention is directed to improvements thereover, which will become apparent as the description proceeds.

Other related patents in this field include Russian Pat. No. 126,911, issued Mar. 30, 1959; French Pat. No. 784,063, issued July 22, 1935; U.S. Pat. No. 3,244,073, issued Apr. 5, 1966; U.S. Pat. No. 3,821,763, issued June 28, 1974; U.S. Pat. No. 3,951,546 issued Apr. 20, 1976 and U.S. Pat. No. 4,011,011, issued Mar. 8, 1977, which is a Continuation of U.S. patent application Ser. No. 339,860 filed Mar. 9, 1973 (now abandoned); "Achievements in Optics" by A. Bouwers, Elsevier Publishing Company, Inc., 1946, (particularly pages 24, 25 and 39); and "New Catadioptric Meniscus Systems" by D. D. Maksutov, Journal of The Optical Society of America, Vol. 34, No. 5, May 1944, pp 270–284.

It is noted that throughout the following specification and claims statements made referring to an annular field of mean radius H also refer to a restricted off-axis field at a distance H from the axis. The terms color or chromatic variation as used herein is intended in its extended sense, i.e., it includes variation with wavelength in any region and is not restricted to visible light.

SUMMARY OF THE INVENTION

In order to accomplish the desired results, the invention provides, in a restricted off-axis field optical system, which includes refractive elements, new and improved means for obtaining stigmatic imagery in the restricted off-axis field over an extended spectral range by balancing the chromatic variation in focus at the center of the restricted off-axis field due to the variation of field curvature with color by introducing axial color aberration of the opposite sense. The term stigmatic imagery, as used herein, is used in its most strict sense, i.e., point-like. The restricted off-axis field is one in which the monochromatic variation of field curvature is sufficiently small that it does not interfere with the objectives of the particular system. An example of such a system is an aperture limited system wherein the monochromatic variation in focus due to field curvature is less than the focal range.

It will be appreciated that a necessary condition for the absence of field curvature (i.e. for a flat image surface) in the resultant system is that the Petzval sum, which is the algebraic sum of the quantities obtained by dividing the power of each surface by its index of refraction be substantially zero, the index of refraction of a reflecting surface being defined as negative one for this computation. The refracting elements, which are essential components of the optical systems in accordance with the invention, result in a chromatic variation of the above mentioned sum so that even though it is substantially zero, there is a resultant variation of the field curvature with color. In accordance with the invention, the focal position is made constant for a broad spectral range by the introduction of an axial longitudinal chromatic difference of focus, which compensates for the change of focus resulting from the chromatic variation of field curvature in the annular field of the optical system. In accordance with an important aspect of the invention, this can be accomplished with a single refracting material. This is particularly important when the system of the invention is to be used in a spectral region such as the ultraviolet in which the number of available refracting materials is small.

In one form of the invention, the restricted off-axis optical system comprises a new and improved annular field optical system which may, for example, be used in apparatus for photographically exposing an image-receiving surface to a light image of an object. This optical system includes at least one convex and one concave mirror, which are substantially concentrically arranged along an optical axis. The system is arranged to form conjugate planes normal to said axis for which the system is of substantially unit power. The system further includes refracting components which result in the variation of field curvature (and hence focus in the off-axis field) with color, and means for introducing axial longitudinal chromatic aberration of the opposite sense to compensate for the variation in field curvature with color in the off-axis field which, in one preferred form thereof, includes at least one pair of symmetrically disposed nearly concentric meniscus elements whose convex radii are larger than their concave radii and whose thickness is greater than the difference between their convex and concave radii. The term thickness as used herein is well known to one skilled in the art to mean axial thickness, if the element is extended to the optical axis.

According to one aspect of the invention, color trimming means are interposed between the mirrors and the object and image locations which, in one form thereof, is a plane parallel plate mounted normal to the optical axis of the mirrors. Preferably, one of the faces of the plane parallel plate is made aspheric, or a weak meniscus element mounted normal to the optical axis of said mirrors is substituted for the plate.

In accordance with another aspect of the invention, the system is made telecentric on both the object and image sides by adjusting the spacing between the convex and concave mirrors. These mirrors are then substantially concentric. According to another aspect thereof, the concave and convex mirrors are arranged so that there are three reflections from the concave mirror and two reflections from the convex mirror.

In one form thereof, the invention provides a new and improved restricted off-axis field optical system having a broad spectral range, which includes refracting means and which may, for example, be used in apparatus for photographically exposing an image-receiving surface to a light image of an object which includes: a first half and a second half with each half including a substantially unit power optical system having an optical axis and having conjugate planes substantially normal to that axis. These two halves are coaxially disposed in back-to-back relationship so that the conjugate planes are superposed on at least one side of the optical system to form an intermediate image location at a position intermediate the two halves, and provision is made for providing spaced object and image locations on the other side of the optical system. According to the invention, the optical system is constructed and arranged so that the Petzval sum, which is the algebraic sum of the quantities obtained by dividing the power of each surface in the system by its index of refraction being substantially zero, with the index of refraction of a reflecting surface being defined as negative one, and said refracting means including means for balancing the effects of the variation in the Petzval sum due to variation in color by introducing axial chromatic aberration of the opposite sense so that the position of focus at the off-axis field remains substantially constant.

In one form of the invention the means for balancing the effects of the variation in Petzval sum due to variation in color comprises, in each half of the optical system, a nearly concentric meniscus element whose convex radius is larger than its concave radius and whose axial thickness is greater than the difference between its convex and concave radii, and according to another aspect at least one color trimming element is provided in the system.

In one embodiment each unit optical system includes a concave spherical mirror and a convex spherical mirror facing the concave mirror, said mirrors being supported with their centers of curvature nearly coincident. Means are provided to define a location for an object the image of which is a real image at a second location, with said convex mirror being positioned to reflect to the concave mirror light from the object location initially reflected to the convex mirror from the concave mirror, whereby light from the object location will be reflected at least twice at the concave mirror and at least once at the convex mirror before being focused at the second location. The exact spacing between the convex and concave mirrors is such that the system is telecentric on both the object and image sides.

Also, in one form of the invention, the color trimming element is a plane parallel plate mounted normal to the optical axis of the mirrors. In some forms of the invention, the color trimming element is mounted at the intermediate image location, and in other forms a color trimming element is mounted in each half of the system.

In some embodiments of the invention, the two halves of the optical system are coaxially disposed in back-to-back relationship so that the conjugate planes are superposed on both sides of the system to form an intermediate image location on one side and a superposed object and image location on the other side. Means, such as folding mirrors, are provided to form spaced object and image locations to make them accessible for practical installations. In other embodiments, the two halves of the optical system are coaxially disposed in back-to-back relationship to form an intermediate image location on one side of the optical system and to form spaced object and image locations on the other side. For this purpose, the intermediate image is spaced axially from the other conjugate in at least one half of the system. In some embodiments, the distance from the two mirror components to the intermediate image is greater than the distance to the other conjugate location in at least one half, thereby spacing said object and image locations one from the other. In still further embodiments, the distance from the two mirror components to the intermediate image is less than the distance to the other conjugate location in at least one half, thereby forming crossed object and image planes. In this case, reflecting means are interposed between the object and image locations to make them physically accessible.

One of the features of the invention resides in the provision of a restricted off-axis field optical system, which greatly reduces high order astigmatism.

Another of the features of the invention resides in the provision of a restricted off-axis optical system, including refracting components, which has a broad spectral range. This feature is important because it is desirable to extend the usable spectrum as wide as possible to get as much energy through the system as possible. In some applications this feature is important also because it results in a reduction of the degrading effects resulting from the temporal coherence of the image forming light.

Still another feature of the invention resides in the provision of an annular field optical system, wherein the width of the corrected annulus is substantially increased. This is particularly important when the system of the invention is used in apparatus for photographically exposing an image-receiving surface, e.g., a wafer, to a light image of an object, as it decreases the exposure time and thereby increases the number of wafers that can be processed in a given period of time. It also makes possible the use of systems in accordance with this invention in step and repeat projection alignment systems.

A further feature of the invention resides in the provision of a restricted off-axis field optical system, wherein scanning difficulties are minimized. Yet another feature thereof resides in the provision of a restricted off-axis field optical system, wherein all of the optical elements may be fabricated from the same optical material and at the same time correction is maintained for a broad spectral range. This is a surprising result, as ordinarily one would correct color by balancing the contributions of elements of different powers and dispersions. This balance is usually maintained over only a restricted spectral range because the relation between the dispersions of different materials varies with the wavelength. Other features of the present invention reside in the provision of a new and improved annular field optical system for use in an apparatus for photographically exposing an image receiving surface to a light image of an object, which is easier to align, with which the magnification can be slightly adjusted, with which stray reflections are minimized, and with which better resolution is achievable.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention.

Specific embodiments of the invention have been chosen for purposes of illustration and description, and are shown in the accompanying drawings, forming a part of the specification.

BRIEF DESCRIPTION OF THE DRAWINGS

FIG. 4 is a schematic representation of an optical system similar to the system of FIG. 3, but simplified by combining the two color trimming elements into a single element of the same form and by eliminating the folding flats required to separate the object and final image by making the conjugate distances of the two-mirror components unequal;

FIGS. 5 to 7 are schematic representations of other embodiments, respectively, of optical systems according to the invention;

FIG. 8 is a schematic representation of an optical system similar to FIG. 1, but showing another embodiment of the invention;

FIG. 9a is a graphic representation showing the variation of the focal position as a function of the distance from the axis and the wavelength of the image forming light;

FIG. 9b is an enlarged schematic representation of a nearly concentric meniscus element according to the invention;

DETAILED DESCRIPTION OF THE PREFERRED EMBODIMENTS

Figure 1:
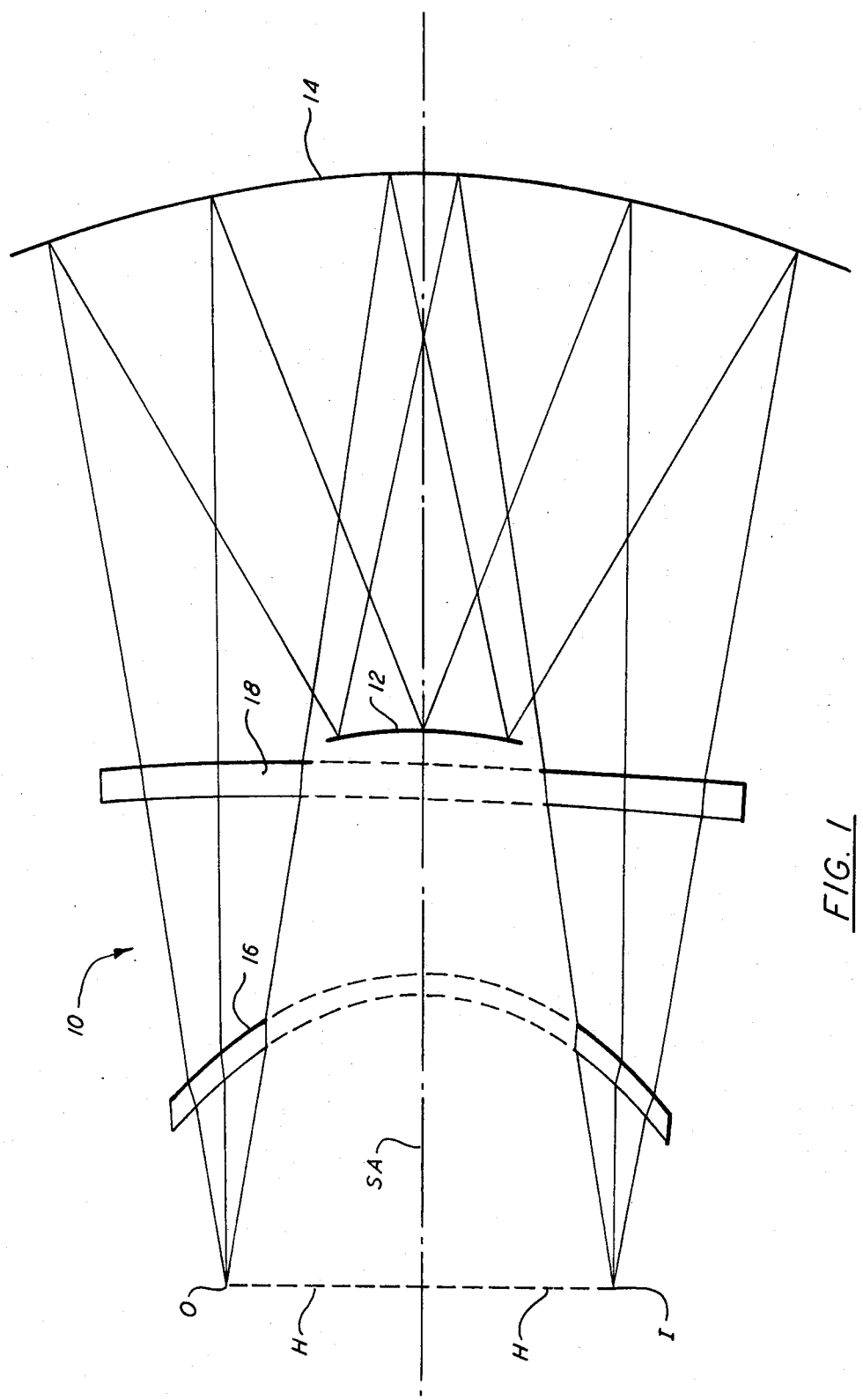
FIG. 1 is a schematic representation of an optical system, constructed in accordance with the concepts of the present invention.

In the embodiment of the invention shown in FIG. 1, the new and improved optical system, indicated generally at 10, comprises two spherical mirrors, a convex mirror 12 and a concave mirror 14, arranged to provide three reflections within the system. The mirrors are arranged with their centers of curvature along the system axis SA and to have off-axis conjugate areas centered at points O and I. The points O and I fall in an annulus centered on the reference axis SA spaced a distance H therefrom, the points O and I being at opposite sides of the axis. In the optical system illustrated in FIG. 2 of my prior U.S. Pat. No. 3,748,015, the concave mirror forms an image of the object O at I; the convex mirror forms a virtual image of point I at the point O which is reimaged by the concave mirror at I. It is noted that the width of the corrected annulus attainable with the optical systems of said patent is limited by the fifth order astigmatism inherent in the design. The high order astigmatism results from the spherical aberration of the principal rays in this system.

As is known from the publication entitled "Achievements in Optics" by A. Bouwers, Elsevier Publishing Company, Inc., 1946, (particularly pages 24, 25 and 39,) and the article appearing in the Journal of *The Optical Society of America,* Volume 34, Number 5, May 1944, pages 270 to 284, entitled "New Catadioptric Meniscus Systems" by D. D. Maksutov, meniscus elements can be used to reduce or remove the spherical aberration of principal rays parallel to the optical axis. Methods of correcting the axial longitudinal color aberration of such systems are also described in these references. The systems in accordance with the present invention differ from the prior art in that they introduce a specified amount of axial color aberration which balances at a restricted off-axis field the variation of focus with color resulting from the chromatic variation of the Petzval sum of the system.

As seen in FIG. 1, a pair of symmetrically disposed meniscus elements 16 are provided for reducing the spherical aberrations of the principal rays. It is noted that the meniscus elements would also be effective for reducing the spherical aberration of the principal rays if they were mounted directly adjacent the convex mirror 12 so that the surface of the mirror 12 and the convex surface of the meniscus elements 16 are parts of the same spherical surface. It will be appreciated that the high order astigmatism has been greatly reduced with the result that the width of the corrected annulus is increased by as much as an order of magnitude more than was possible in the system of my prior patent.

A necessary condition for the absence of field curvature, i.e., for a flat image surface, in the resultant system is that the algebraic sum of the quantities obtained by dividing the power of each surface by its index of refraction be substantially zero, the index of refraction of a reflecting surface being defined as negative one for this computation. The algebraic sum is called the Petzval sum. Since the index of refraction of the meniscus elements varies with the wavelength of the image-forming light, it will be appreciated that the incorporation of these elements in the optical system results in a variation of the Petzval sum with wavelength. This results in a variation of the focal position as a function of the distance from the axis and as a function of the wavelength or color of the image-forming light, as shown at a, b and c in FIG. 9a. In an annular field optical system, the variation with distance from the axis is effectively removed by restricting the field to an annulus whose mean distance from the axis is constant. The variation of field curvature with wavelength in such a system becomes a variation of focal position with wavelength and it can be balanced by the introduction of axial color aberration of the opposite sense. To accomplish this in accordance with the invention, the refracting meniscus departs from exact concentricity by having its convex radius of curvature shorter than the sum of its concave radius and its thickness. That is, its axial thickness is greater than the difference between the radii of its convex and concave surfaces. In effect, this departure from concentricity results in a variation of the focal position as a function of the distance from the axis and as a function of the wavelength of the image-forming light, as shown at b' and c' in FIG. 9a. Thus, for light of long wavelength, the focus curve moves from b to b' and for short wavelength from c to c'. The way in which this works can be explained as follows:

The variation of field curvature with wavelength introduced by a nearly concentric meniscus whose power is negative is such that the back focal length at an off-axis position is greater for short wavelengths than for long wavelengths. A concentric meniscus with a conjugate at its center of curvature does not introduce any longitudinal color aberration. The same is substantially true of such a meniscus with a conjugate near its center of curvature. The addition of a positive lens to such a meniscus introduces longitudinal color of the sense required to balance the variation in focus with wavelength resulting from the variation of the field curvature (contributed by the meniscus) with wavelength. This can be accomplished by making the convex radius of the meniscus shorter than the sum of its concave radius and its thickness. For purposes of explanation, it could be considered that, instead of adding a positive lens to the concentric meniscus a,b,c,d in FIG. 9b, you get the same effect by subtracting a negative lens a,b,d. The nearly concentric meniscus a, c, d is then equivalent to two lenses, one being a fictitious concentric meniscus with convex radius equal to the sum of the concave radius and the thickness, while the second is a zero thickness positive meniscus whose concave radius is the convex radius of the fictitious meniscus and whose convex radius is the convex radius of the actual meniscus.

For a nearly concentric meniscus, as shown at a,c,d in FIG. 9b, with concave radius $R_1$, convex radius $R_2$, thickness t, and refractive index N, and conjugates near its centers of curvature, the longitudinal color compensates for the change in focus due to the variation of Petzval field curvature with wavelength in an annulus of mean radius H when $$R_2 > R_1$$

$$\text{and } t \approx R_2 - R_1 + (H^2/2N^2)(1/R_1 - 1/R_2) \quad (1)$$

I have found that the introduction of a pair of menisci whose parameters substantially satisfy equation (1) into an optical system of the type disclosed in my aforementioned U.S. Pat. No. 3,748,015, together with accompanying modifications which will be discussed more fully hereinafter, results in a reduction in the high order astigmatism over a wide spectral band. When the parameters of the meniscus are chosen so that its thickness is related to its radius by the equation (1), and the conjugate planes are near the centers of curvature of the meniscus, the contribution of the meniscus to the astigmatism of the system varies with wavelength so that it cannot be highly corrected for an extended spectral range at a high numerical aperture. A value of the thickness greater than that given by the relation (1) can be found for which the variation of astigmatism with wavelength is removed. The longitudinal color resulting from the new thickness is greater than that needed to compensate for the change in focus in the off-axis restricted field resulting from the change of Petzval sum of the meniscus with wavelength, and has the effect of moving the intersection of the curves b' and c' in FIG. 9a out of the annular field region to a point above that region. To compensate for this and bring the balance point back into the annular field region, systems according to the present invention are preferably provided with further refractive means, herein called color trimming means, color trimming elements, or color trimming plates, which compensate for the additional axial color aberration without affecting the astigmatism. In one form the color trimming element is a plane parallel plate of appropriate thickness introduced into a part of the optical system in which the principal rays are parallel to or nearly parallel to the optical axis, which serves to trim the longitudinal color to the desired amount without affecting the astigmatism or Petzval sum at any wavelength. Such a plate is shown at 18 in FIG. 1. The color compensation can be maintained for a large spectral range by using the same optical material for the color trimming plate and the nearly concentric meniscus.

Further improvement can be obtained from the color trimming plate by modifying the plane parallel plate in one of two ways:

(1) One of the faces of the plane parallel plate may be made aspheric.

(2) The plane parallel plate may be "bent" resulting in a weak meniscus element.

The highest degree of correction at numerical apertures greater than 0.15 has been obtained with a system in which the thickness of the menisci is greater than the value given by equation (1) and in which color compensation is obtained by adding color trimming means constructed in accordance with one of the two ways described above. The convex mirror 12 is located at a position along the axis which results in a system which is telecentric at both the object O and the image I. This means that a ray parallel to the axis from the object O will traverse a path which is also parallel to the axis at the image I. In systems like that of FIG. 1 which are symmetrical in the sense that they are reversible, this means that the path of a ray parallel to the optical axis at the object O through the optical system is symmetrical; that is that the portion of the ray path from the object to the midpoint of the system is a mirror image of the portion from the image to the midpoint of the system. The concave and convex mirrors are then substantially concentric, as the term is used throughout the present specification and claims.

Table 1 is an example, indicating the construction data, of the annular field optical system of FIG. 1. As is customary a plus sign is used to denote that a surface is convex to the object and that distance is measured from left to right whereas a minus sign is used to denote that a surface is concave to the object and that a distance is measured from right to left.

TABLE 1

| | RADIUS OF ANNULUS = 100 mm. | | | |
|---|---|---|---|---|
| SURFACE NO. FROM OBJECT TO IMAGE | RADIUS (mm) | DISTANCE TO NEXT SURFACE (mm) | MATERIAL | NOTE |
| 0 | (PLANE) | 144.92 | AIR | OBJECT |
| 1 | −144.96 | 11.03 | FUSED SILICA | |
| 2 | −151.75 | 88.70 | AIR | |
| 3 | −957.30 | 16.75 | FUSED SILICA | |
| 4 | −967.84 | 295.25 | AIR | |
| 5 | −551.15 | −279.07 | AIR | MIRROR |
| 6 | −267.18 | 279.07 | AIR | MIRROR |
| 7 | −551.15 | −295.25 | AIR | MIRROR |
| 8 | −967.84 | −16.75 | FUSED SILICA | |
| 9 | −957.30 | −88.70 | AIR | |
| 10 | −151.75 | −11.03 | FUSED SILICA | |
| 11 | −144.96 | −144.92 | AIR | |
| 12 | (PLANE) | | | IMAGE |

The system specified in Table I was designed to be used in the spectral range 280 nanometers to 400 nanometers. For this spectral range, the variation in focus due to variation of the Petzval sum with wavelength at a distance 100 millimeters from the axis is 0.036 millimeters. The nearly concentric meniscus elements 16 (specified at surfaces 1 and 2, and surfaces 10 and 11 of Table I) introduces 0.223 millimeters of axial difference of focus in the reverse sense due to chromatic aberration. The axial difference of focus with wavelength is trimmed to the value 0.038 millimeters by the weak meniscus elements 18 (specified at surfaces 3 and 4 and surfaces 8 and 9 of Table I) in the sense desired to compensate for the variation in focus at 100 millimeters from the axis due to the chromatic variation of the Petzval sum. There is a residual third order variation of astigmatic difference of focus of 0.018 millimeters. In accordance with the formula (1) above, the thickness of the meniscus elements 16 would be 7.50 millimeters. With this thickness, the two menisci would have introduced 0.036 millimeters of axial difference of focus in the sense required to compensate for the chromatic difference in focus at 100 millimeters from the axis due to the effects of the variation of the Petzval sum with color. However, the variation with wavelength of the astigmatism introduced by meniscus elements of that thickness would be intolerable at the numerical aperture 0.17 for which the system was designed. For this reason the thickness of these elements was increased to 11.03 millimeters.

The convex mirror 12 is located at a position along the axis such that a ray parallel to the axis from the object O at the distance H = 100 millimeters from the axis traverses the system symmetrically; that is, the ray path from the object O to the convex mirror 12 is a mirror image of the ray path of a ray parallel to the axis from the image I to the convex mirror 12. The convex mirror 14 and the convex mirror 12 are then substantially concentric. The distance between their centers of curvature is 4.9 millimeters which is 1.8% of the shorter radius.

The color trimming elements 18 depart only slightly from a "bent" plane parallel plate. (In a "bent" plane parallel plate the radii of their two surfaces would be equal.) Their contribution to the variation of focus due to chromatic variation of Petzval sum and chromatic variation of astigmatism is 0.001 millimeter which is negligible.

Table II is a table of the computed performance of the annular field optical system of Table I over an extended spectral range (2800 Å to 5461 Å) in terms of the rms wave aberration at various annular radii. It may be noted that this is a greater range than that for which the system was designed. The width of the usable annulus is the difference between the values of the upper and lower radii for which the performance is adequate for the application. It is noted that a system is usually called "diffraction limited", or more precisely "aperture limited" when the rms wave aberration is as high as 0.09 or 0.1 at the edges of the annulus when the system is used in a scanning mode.

TABLE II

| | N.A. = 0.17 AT OBJECT AND IMAGE | | | | | |
|---|---|---|---|---|---|---|
| | RMS WAVE ABERRATION (WAVELENGTH UNITS) | | | | | |
| RADIUS OF | WAVELENGTH (ANGSTROM UNITS) | | | | | |
| ANNULUS (mm) | 2800 | 3200 | 3650 | 4000 | 4358 | 5461 |
| 105 | .09 | .12 | .13 | .13 | .13 | .12 |
| 104 | .05 | .08 | .09 | .09 | .09 | .08 |
| 103 | .02 | .04 | .05 | .06 | .06 | .05 |
| 100 | .02 | .01 | .01 | .01 | .01 | .01 |
| 97 | .04 | .01 | .02 | .02 | .02 | .03 |
| 96 | .06 | .02 | .02 | .03 | .03 | .03 |
| 95 | .08 | .04 | .04 | .04 | .04 | .04 |
| 94 | .11 | .06 | .05 | .05 | .05 | .05 |
| 93 | .13 | .08 | .07 | .07 | .06 | .06 |

As indicated hereinbefore, the annular field optical system of the present invention provides at least one convex and one concave mirror, which are substantially concentrically arranged along an optical axis to form conjugate planes normal to said axis for which the system is of unit power. FIG. 1 shows one suitable arrangement of the convex and concave mirrors, and other suitable arrangements of these mirrors are shown and described in my prior U.S. Pat. No. 3,748,015. FIG. 8 of the present specification shows an arrangement which includes a convex mirror 12e and a concave mirror 14e arranged substantially concentrically along an optical axis SA in a manner utilizing a total of five reflections within the system, there being three reflections from the concave mirror 14e and two from the convex mirror 12e. In this embodiment the algebraic sum of the powers of the reflecting surfaces utilized is zero when the radius of the convex mirror 12e is two-thirds that of the concave mirror 14e. In a manner similar to that described in connection with the embodiment of FIG. 1, the system of FIG. 8 includes meniscus elements 16e and a color trimming plate 18e that function in the aforesaid manner.

In the system of FIG. 8, the spacing between the concave mirror 14e and the convex mirror 12e is such that a ray parallel to the axis from the object O traverses the system symmetrically. As in the system of FIG. 1 the mirrors are then substantially concentric.

Figure 2:
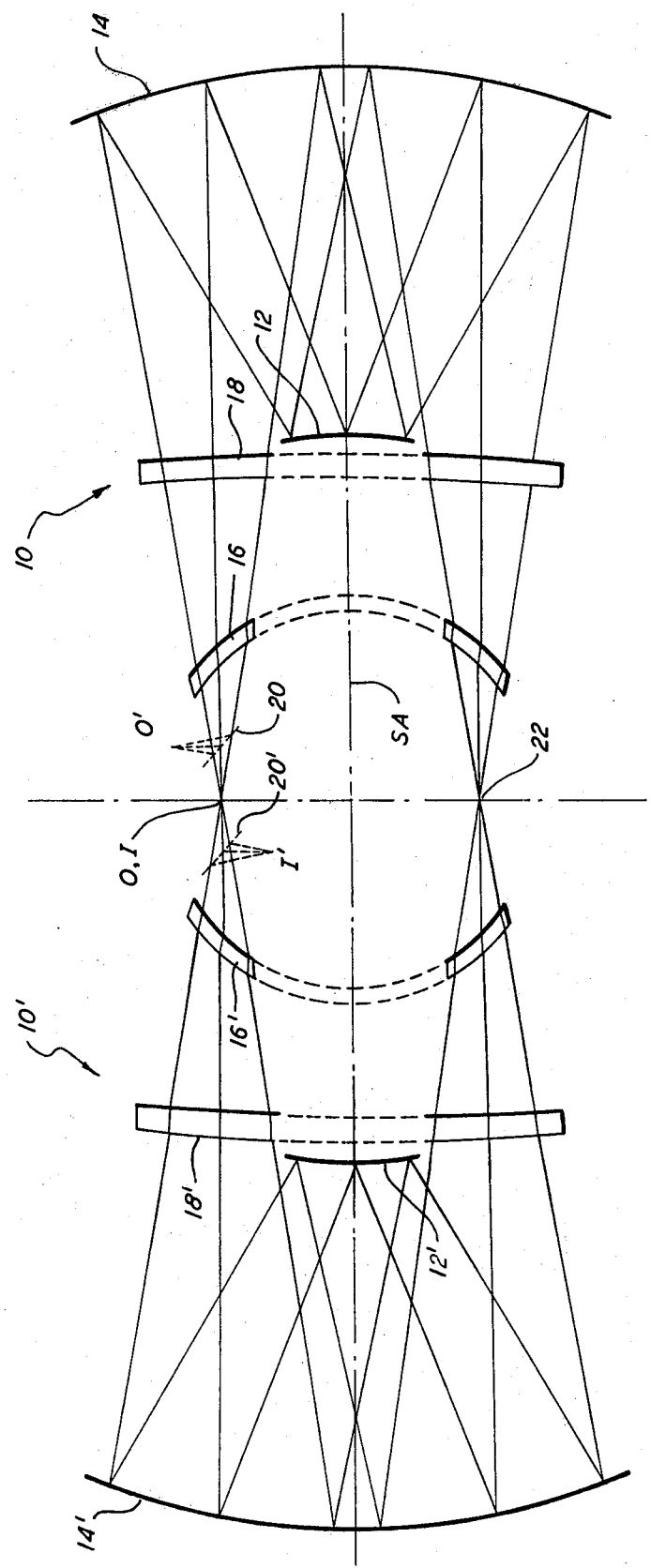
FIG. 2 is a schematic representation of a double optical system, wherein two optical systems similar to the system of FIG. 1 are mounted in back-to-back relationship.

It is noted that annular field optical systems of the type described may be used in a scanning mode and for this purpose it is highly desirable that the orientation of the object and image be the same so that their physical supports can be maintained in fixed relation to each other while being moved relative to the optical system for scanning and so that the accuracy requirements of the scanning motion are minimized. An arrangement that achieves this by incorporating three flat mirrors in the optical system was shown in the aforesaid U.S. Pat. No. 3,951,546. I have discovered another means of achieving this effect, by using two optical systems 10 and 10', each being of the type shown in FIG. 1, disposed in back-to-back relationship so that the object and image planes are superposed, as illustrated in FIG. 2. Thus, the optical system 10 includes two spherical mirrors 12 and 14, a pair of meniscus elements 16 and a color trimming element 18, and the symmetrical optical system 10' includes two spherical mirrors 12' and 14', a pair of meniscus elements 16' and a color trimming element 18'. The physical separation between the object and final image required for a practical arrangement is obtained by the addition of folding mirrors 20 and 20' shown by broken lines in FIG. 2, to move the actual object and image to O' and I', respectively. In this arrangement the separation between the folding mirrors must be sufficient to provide clearance for scanning. It will, of course, be appreciated that other arrangements of folding flats, which retain the relative orientation of the object and image, are within the scope of this invention.

Figure 3:
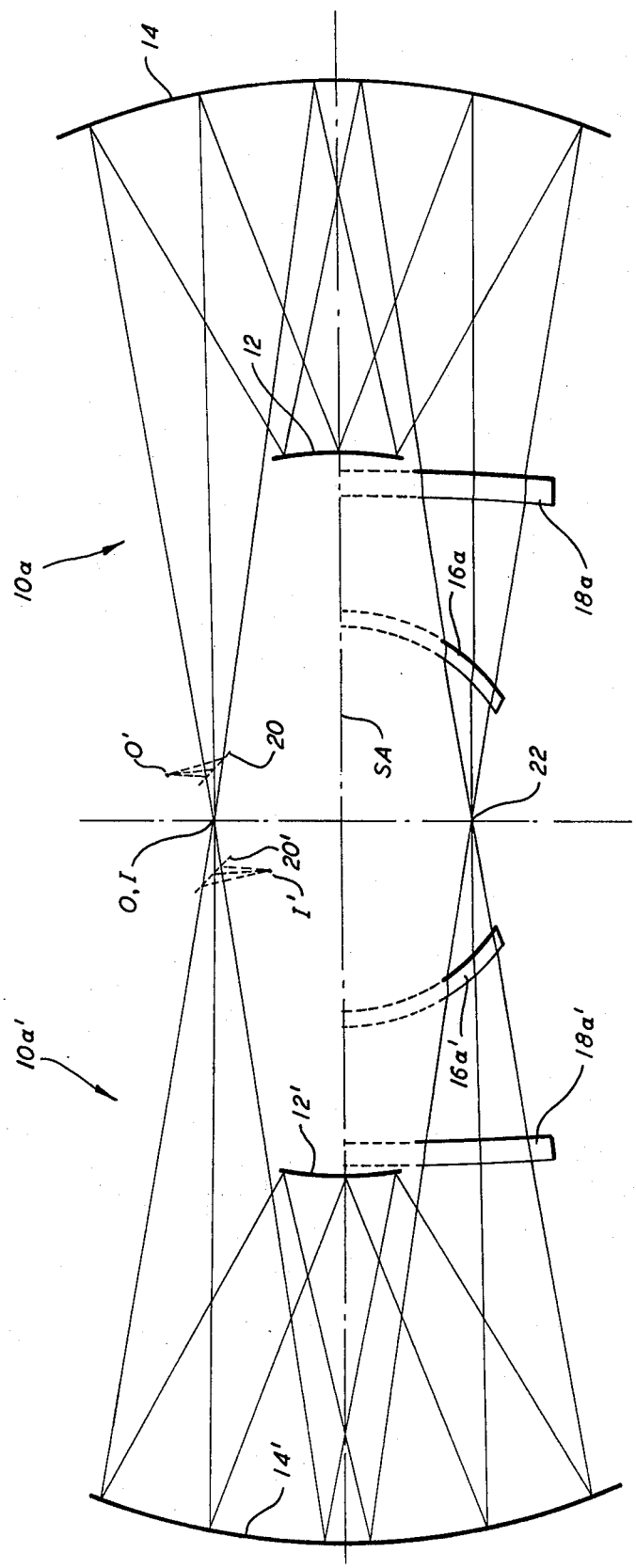
FIG. 3 is a schematic representation of an optical system similar to the system of FIG. 2, but simplified by removing the requirement that each half of the system be symmetrical, while keeping the system symmetrical as a whole.

In the optical system of FIG. 2, the intermediate image, indicated at 22 at a position intermediate the two halves, is highly corrected because it is formed by the optical system 10 of FIG. 1. In this arrangement, each half 10 and 10', of the system is longitudinally symmetrical and thus reversible. Since for most applications a high degree of correction at the intermediate image is not required, the system can be simplified by removing the requirements that each half of the system be symmetrical, while keeping the system or at least the refractive components thereof symmetrical as a whole, and thereby reduce the number of compensating menisci and trimming elements to two each, as illustrated in the embodiment of FIG. 3. Thus, a half of the optical system, indicated at 10a, comprises two spherical mirrors 12 and 14, a meniscus element 16a and a color trimming element 18a disposed on the side of the intermediate image 22, all of said elements being symmetrically disposed about the optical axis SA. The other half of the optical system, indicated at 10a', comprises two spherical mirrors 12' and 14', a meniscus element 16a' and a color trimming element 18a' disposed on the side of the intermediate image 22, all of said elements being symmetrical about the optical axis SA. For the same reasons indicated hereinbefore, each half of the optical system is provided with a folding mirror 20 and 20' shown by the broken lines in FIG. 3, to move the actual object and final image to O' and I', respectively.

Referring next to the embodiment of FIG. 4, it will be appreciated that systems with an intermediate image, indicated at 22, can be further simplified by combining the two color trimming elements 18a and 18a' of the embodiment of FIG. 3 into a single element of the same form as indicated at 18b in FIG. 4. Symmetry is maintained by placing the single color trimming element 18b at or closely adjacent the intermediate image 22. Further, the folding mirrors 20 and 20' of FIG. 3 can also be eliminated by making unequal the conjugate distance of at least one of the two-mirror components 12b, 14b, and 12b', 14b'. That is, the intermediate image distance to the two-mirror component is made greater than the object and/or image distances, to thereby space the final image I from the object O. In this system, the color trimming element 18b at the intermediate image can be a true plane parallel plate.

In a truly afocal system, the magnification is the same for all conjugate positions. However, this desirable feature is not achieved in practical applications because real systems do not in general remain truly afocal for all field positions. In the unit magnification system of FIG. 4, for example, if the object O and image I are moved together longitudinally by 1 mm., the magnification of a 4 mm. radial annulus varies from unity by $\pm 0.00032$. This variation, which results in tracking smear during scanning, can be reduced to $-+0.00001$ by aspherizing one of the faces of the color trimming element 18b.

A modification of the optical system of FIG. 4 is illustrated in FIG. 5, wherein the correcting menisci are moved from the intermediate image side of the system to the object-image side thereof. In the embodiment of FIG. 5, one half of the system includes two spherical mirrors 12b and 14b and a meniscus element 16c disposed on the object-image side and symmetrically about the system axis SA, and the other half of the system includes two spherical mirrors 12b' and 14b' and a meniscus element 16c' also disposed on the object-image side and symmetrically about the system axis SA. A single color trimming plate 18b is disposed symmetrically about the system axis or closely adjacent the intermediate image 22. As in the embodiment of FIG. 4, one of the faces of this plate is aspherized. Further, as in the embodiment of FIG. 4, the intermediate image distances to the two-mirror components are made greater than the object and image distances, to thereby space the final image I from the object O for scanning purposes.

Table III is an example, indicating the construction data, of the annular field optical system of FIG. 5.

TABLE III

| SURFACE NO. FROM OBJECT TO IMAGE | RADIUS OF ANNULUS = 100 mm. | | | |
|---|---|---|---|---|
| | RADIUS(mm) | DISTANCE TO NEXT SURFACE (mm) | MATERIAL | NOTE |
| 0 | (PLANE) | 107.13 | AIR | OBJECT |
| 1 | −128.18 | 10.48 | FUSED SILICA | |
| 2 | −135.29 | 378.48 | AIR | |
| 3 | −541.32 | −273.56 | AIR | MIRROR |
| 4 | −264.61 | 273.56 | AIR | MIRROR |
| 5 | −541.32 | −590.28 | AIR | MIRROR |
| 6 | −1772.58* | −7.01 | FUSED SILICA | ASPHERIC |
| 7 | (PLANE) | −587.26 | AIR | |

TABLE III-continued
RADIUS OF ANNULUS = 100 mm.

| SURFACE NO. FROM OBJECT TO IMAGE | RADIUS(mm) | DISTANCE TO NEXT SURFACE (mm) | MATERIAL | NOTE |
|---|---|---|---|---|
| 8 | 541.32 | 273.56 | AIR | MIRROR |
| 9 | 264.61 | −273.56 | AIR | MIRROR |
| 10 | 541.32 | 378.48 | AIR | MIRROR |
| 11 | 135.29 | 10.48 | FUSED SILICA | |
| 12 | 128.18 | 107.13 | AIR | |
| 13 | (PLANE) | | | IMAGE |

*ASPHERIC SURFACE SYMMETRICAL ABOUT OPTICAL AXIS.
DEPARTURE, X, FROM PLANE SURFACE AT DISTANCE r FROM AXIS:

$$X = 1772.58 + \sqrt{1772.58 - r^2} + 1.732 \times 10^{-8} r^4 + 4.210 \times 10^{-13} r^6 + 8.278 \times 10^{-18} r^8 - 4.078 \times 10^{-21} r^{10}$$

The system specified in Table III was designed to be used at numerical aperture 0.17 at both the object and image for the spectral range 280 nanometers to 400 nanometers. At this numerical aperture the thickness of the nearly concentric menisci 16c and 16c' (surfaces 1 and 2, and surfaces 11 and 12 of Table III) is appreciably greater than the 8.05 millimeters computed by the equation (1) above because of the requirement that the chromatic variation of astigmatism be tolerable at numerical aperture 0.17. With the help of the color trimming plate 18b (surfaces 6 and 7 of Table III) the axial longitudinal difference of focus is 0.040 millimeters in the undercorrected sense. The difference in focus at 100 millimeters from the axis due to chromatic variation of the Petzval sum is only 0.014 millimeters in the overcorrected sense. However, there is an additional 0.027 millimeters difference of focus at 100 millimeters from the axis in the overcorrected sense because of chromatic variation of the fifth order Petzval sum, which is computed in a more complicated manner than the Petzval sum. At 100 millimeters from the axis the difference in focus due to chromatic variation of Petzval curvature is thus balanced by axial longitudinal chromatic aberration.

The convex mirrors 12b and 12b' are located symmetrically along the axis so that a ray parallel to the axis from the object O at a distance 100 millimeters from the axis traverses the system symmetrically. This implies that the path of this ray in the space between the concave mirrors 14b and 14b' is parallel to the optical axis. The convex mirrors 12b and 12b' are then substantially concentric with the concave mirrors 14b and 14b', respectively. The centers of curvature of the mirrors 12b and 12b' are each 3.15 millimeters from the centers of curvature of the mirrors 14b and 14b'. This is a departure from concentricity of 1.2% of the radius of the convex mirrors.

Table IV is a table for the computed performance of the annular field optical system of Table III over an extended spectral range (2800 Å to 5461 Å) in terms of the rms wave aberration of various annular radii. The width of the usable annulus is the difference between the values of the upper and lower radii for which the performance is adequate for the application.

TABLE IV

| | N.A. = 0.17 AT OBJECT AND IMAGE | | | | | |
|---|---|---|---|---|---|---|
| RADIUS OF ANNULUS (mm) | RMS WAVE ABERRATION (WAVELENGTH UNITS) WAVELENGTH (ANGSTROM UNITS) | | | | | |
| | 2800 | 3200 | 3650 | 4000 | 4358 | 5461 |
| 103 | .08 | .08 | .08 | .08 | .08 | .07 |
| 102 | .06 | .05 | .05 | .05 | .04 | .04 |
| 100 | .05 | .04 | .04 | .03 | .03 | .03 |
| 98 | .06 | .04 | .04 | .04 | .04 | .05 |
| 97 | .09 | .06 | .05 | .05 | .05 | .06 |
| 96 | .13 | .09 | .08 | .07 | .07 | .07 |

Figure 6:
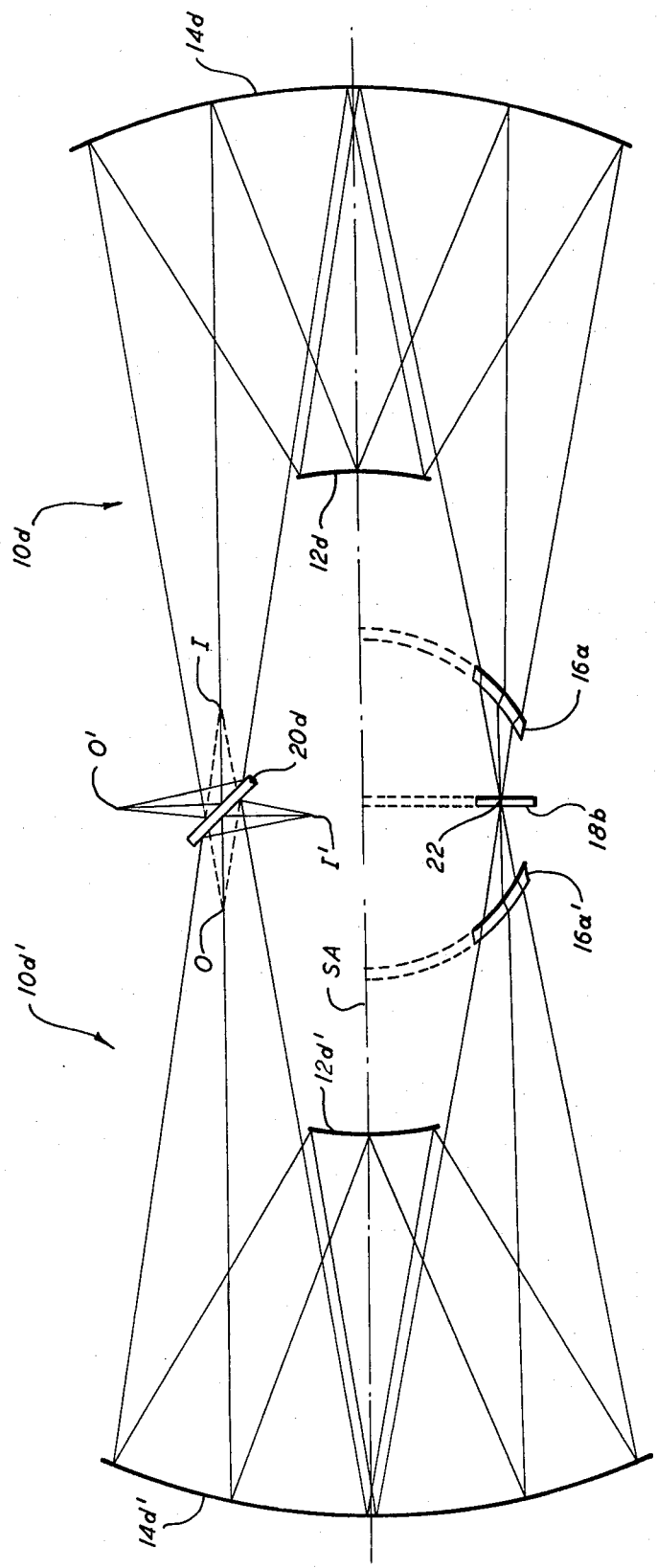

An optical system in which the distances from the intermediate image 22 to the two-mirror components 12d–14d and 12d'–14d' are less than the distances from the object O and final image I is shown in FIG. 6. In the embodiment of FIG. 6, one half of the system includes two spherical mirrors 12d and 14d and a meniscus element 16a disposed on the intermediate image side and symmetrically about the system axis SA, and the other half of the system includes two spherical mirrors 12d' and 14d' and a meniscus element 16a' also disposed on the intermediate image side and symmetrically about the system axis SA. A single color trimming plate 18b is disposed at or closely adjacent the intermediate image 22. Parallel folding flats, as in the systems of FIGS. 2 and 3 are introduced between the two crossed conjugate positions O and I to make them accessible for scanning purposes. However, in the embodiment of FIG. 6, the two folding flats are the front and back surfaces of a plane parallel plate 20d, whose thickness is determined by mechanical considerations, in contrast to the arrangements of FIGS. 2 and 3 in which other considerations determined the separation between the reflecting surfaces. Thus, in the embodiment of FIG. 6, the front and back surfaces of the plate 20d serve to deflect the object O to O' and the final image I to I', thereby providing the spacing therebetween necessary for scanning.

Figure 7:
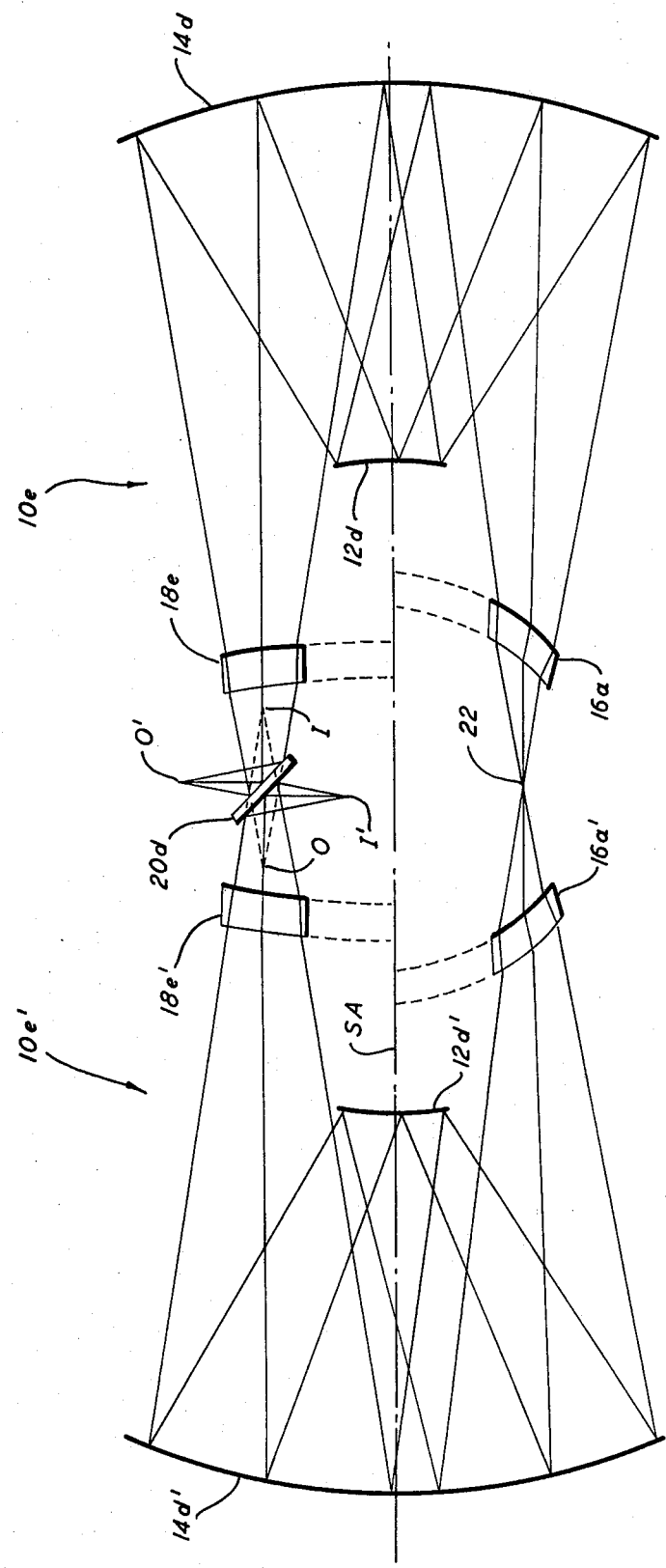

Another embodiment of the invention utilizing crossed object and image planes is shown in FIG. 7, wherein the single color trimming plate 18b of FIG. 6 at the intermediate image has been replaced by two spaced, color trimming plates 18e and 18e' on the object-image side of the system. In this embodiment, the substantially plane parallel plates have been "bent" to form a weak meniscus element. The remainder of the system of FIG. 7 is similar to that of FIG. 6. That is, one half of the system includes two spherical mirrors 12d and 14d and a meniscus element 16a disposed on the intermediate image side, and the other half of the system includes two spherical mirrors 12d' and 14d' and a meniscus element 16a' also disposed on the intermediate image side. As described hereinbefore in connection with the embodiment of FIG. 6, plate 20d having mirror front and back surfaces serves to move the object O to O' and the final image I to I' to provide physical separation between the object and image as required for a practical arrangement.

Table V is an example, indicating the construction data, of the annular field optical system of FIG. 7.

TABLE V

RADIUS OF ANNULUS = 100 mm.

| SURFACE NO. | RADIUS (mm) | DISTANCE TO NEXT SURFACE (mm) | MATERIAL | NOTE |
| --- | --- | --- | --- | --- |
| 0 | (PLANE) | 151.33 | AIR | OBJECT |
| 1 | −726.89 | 28.69 | FUSED SILICA | |
| 2 | −730.32 | 410.82 | AIR | |
| 3 | −552.06 | −280.16 | AIR | MIRROR |
| 4 | −267.18 | 280.16 | AIR | MIRROR |
| 5 | −552.06 | −363.25 | AIR | MIRROR |
| 6 | −160.78 | −24.03 | FUSED SILICA | |
| 7 | −145.19 | −272.77 | AIR | |
| 8 | 145.19 | −24.03 | FUSED SILICA | |
| 9 | 160.78 | −363.25 | AIR | |
| 10 | 552.06 | 280.16 | AIR | MIRROR |
| 11 | 267.18 | −280.16 | AIR | MIRROR |
| 12 | 552.06 | 410.82 | AIR | MIRROR |
| 13 | 730.32 | 28.69 | FUSED SILICA | |
| 14 | 726.89 | 151.33 | AIR | |
| 15 | (PLANE) | | | IMAGE |

The system specified in Table V is also designed to be used at numerical aperture 0.17 for the spectral range 280 nanometers to 400 nanometers. In order to eliminate the chromatic variation of astigmatism the nearly concentric menisci 16a and 16a' (surfaces 6 and 7 and surfaces 8 and 9 of Table V) are made thicker than the 17.10 millimeters resulting from the equation (1). The color is trimmed by the meniscus elements 18e and 18e' (surfaces 1 and 2 and surfaces 13 and 14 of Table V) which like the elements 18 of FIG. 1 are modified "bent" plane parallel plates. In this system the difference in focus due to chromatic variation of Petzval sum at 100 millimeters from the axis is 0.076 millimeters in the overcorrected sense. This is balanced by an axial undercorrected chromatic aberration of 0.078 millimeters.

The convex mirrors 12d and 12d' are located symmetrically at locations such that a ray parallel to the axis from the object O at a distance 100 millimeters from the axis traverses the system symmetrically so that the portion of the path of this ray between the menisci 16a and 16a' is parallel to the optical axis. This results in substantially concentric mirror pairs 12d and 14d, and 12d' and 14d'. The center of curvature of the convex mirror in each case is 4.72 millimeters from that of the closest concave mirror. The departure from concentricity is thus 1.77% of the radius of the convex mirror.

Table VI is a table for the computed performance of the annular field optical system of Table V over an extended spectral range (2800 Å to 5461 Å) in terms of the rms wave aberration at various annular radii. The width of the usable annulus is the difference between the values of the upper and lower radii for which the performance is adequate for the application.

TABLE VI

N.A. = 0.17 AT OBJECT AND IMAGE

| RADIUS OF ANNULUS (mm.) | RMS WAVE ABERRATION (WAVELENGTH UNITS) WAVELENGTH (ÅNGSTROM UNITS) | | | | | |
| --- | --- | --- | --- | --- | --- | --- |
| | 2800 | 3200 | 3650 | 4000 | 4358 | 5461 |
| 104 | .08 | .07 | .09 | .10 | .10 | .11 |
| 103 | .06 | .04 | .05 | .06 | .07 | .08 |
| 102 | .05 | .02 | .03 | .04 | .05 | .06 |
| 100 | .03 | .02 | .02 | .02 | .03 | .04 |
| 98 | .07 | .04 | .03 | .03 | .02 | .03 |
| 97 | .10 | .06 | .05 | .04 | .04 | .03 |
| 96 | .14 | .09 | .07 | .06 | .06 | .05 |

Figures 10, 10A:
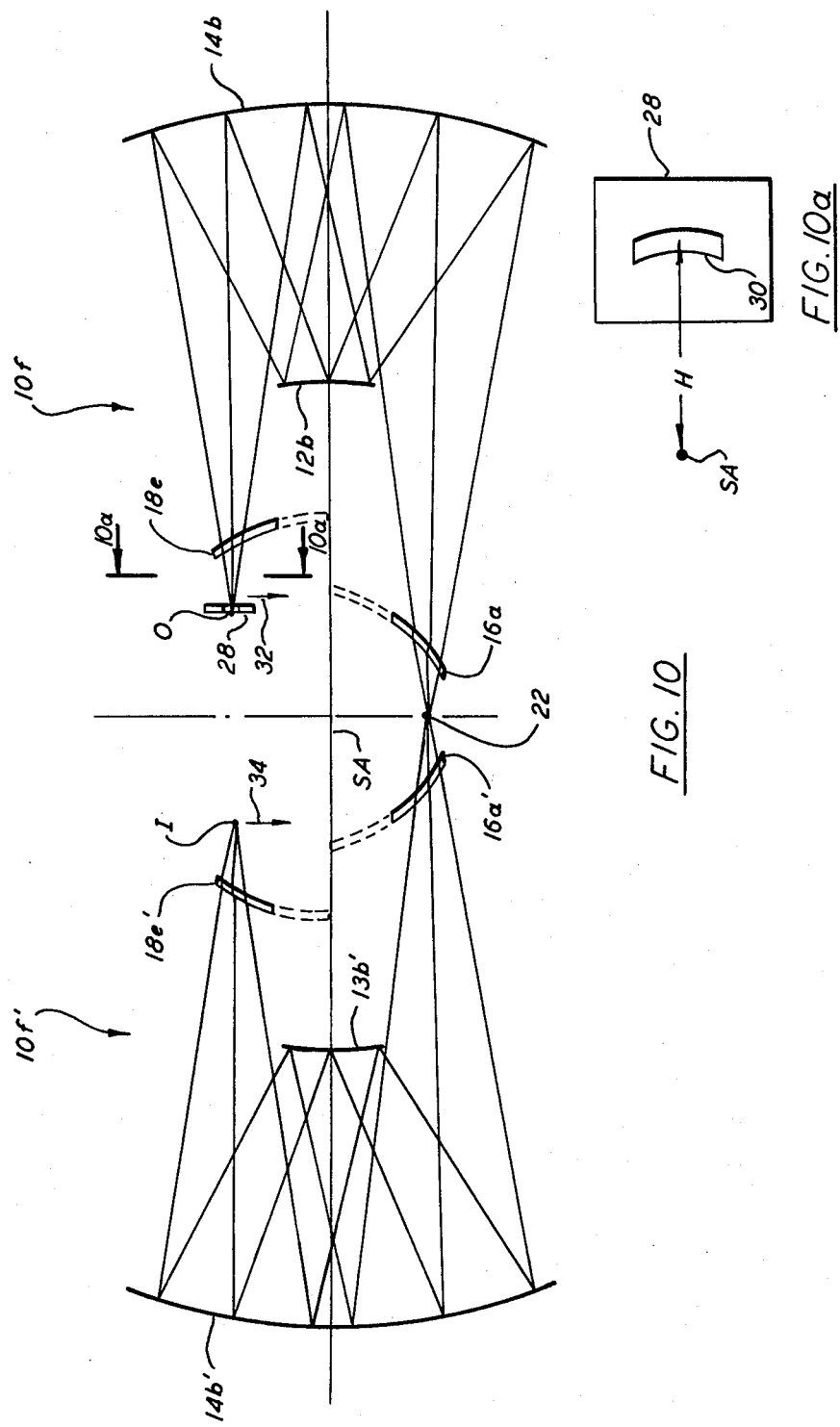
FIG. 10 is a schematic representation of still another embodiment of an optical system constructed in accordance with the concepts of the present invention.
FIG. 10a is an enlarged view taken along the line 10a—10a of FIG. 10.

FIG. 10 shows still another embodiment of the invention. This embodiment is somewhat similar to the embodiment of FIG. 7, except that plate 20d having folding mirrors on its front and back surfaces has been eliminated. This is effected by making unequal the conjugate distance of at least one of the two mirror components 12b, 14b, and 12b', 14b'. That is, the intermediate image distance to the two-mirror component is made greater than the object and/or image distances, to thereby space the final image I from the object O. Thus, one half 10f of the system of FIG. 10 includes two spherical mirrors 12d and 14d, a meniscus element 16a disposed on the intermediate image side and a color trimming plate 18e on the object-image side of the system. The other half 10f' of the system includes two spherical mirrors 12d' and 14d', a meniscus element 16a' disposed on the intermediate image side and a color trimming plate 18e' on the object-image side of the system. As in the embodiment of FIG. 7, the color trimming elements are menisci. The meniscus elements 18e and 18e' are modified "bent" plane parallel plates whose function is to trim the longitudinal chromatic under correction provided by the meniscus elements 16a and 16a' to the value required to balance the over corrected focal difference at the off-axis image resulting from the chromatic variation of the Petzval sum of the refracting elements. All of said elements are symmetrically disposed along the optical axis SA.

Table VII is an example, indicating the construction data of the annular field optical system of FIG. 10.

TABLE VII

RADIUS OF ANNULUS = 100 mm.

| SURFACE NO | RADIUS (mm.) | DISTANCE TO NEXT SURFACE (mm.) | MATERIAL | NOTE |
| --- | --- | --- | --- | --- |
| 0 | (PLANE) | 88.41 | AIR | OBJECT |
| 1 | −212.36 | 8.37 | FUSED SILICA | |
| 2 | −217.77 | 394.30 | AIR | |
| 3 | −539.26 | −271.74 | AIR | MIRROR |
| 4 | −264.45 | 271.74 | AIR | MIRROR |
| 5 | −539.26 | −476.12 | AIR | MIRROR |
| 6 | −128.55 | −6.68 | FUSED SILICA | |
| 7 | −123.91 | −220.54 | AIR | |
| 8 | 123.91 | −6.68 | FUSED SILICA | |
| 9 | 128.55 | −476.12 | AIR | |
| 10 | 539.26 | 271.74 | AIR | MIRROR |
| 11 | 264.45 | −271.74 | AIR | MIRROR |
| 12 | 539.26 | 394.30 | AIR | MIRROR |
| 13 | 217.77 | 8.37 | FUSED SILICA | |
| 14 | 212.36 | 88.41 | AIR | |
| 15 | (PLANE) | | | IMAGE |

The system specified in Table VII was designed to be used in the spectral range 240 nanometers to 365 nanometers at numerical aperture 0.17 at both the object and the image. For this spectral range, the variation in focus due to the variation of the Petzval sum with wavelength at a distance 100 millimeters from the axis is 0.071 millimeters in an over corrected sense, i.e., the back focus with 240 nanometer light is 0.071 millimeters longer than the back focus with 365 nanometer light. The axial undercorrected longitudinal chromatic aberration is 0.074 millimeters so that it substantially compensates for the chromatic difference in focus at 100 millimeters from the axis due to the chromatic aberration of the Petzval sum. The thickness of the almost concentric menisci 16a and 16a' (surfaces numbered 7 and 8, and 9 and 10 in Table VII) is appreciably greater than the 5.30 millimeters called for by the equation (1) as is necessary to keep the chromatic variation of astigmatism small in a system used at numerical aperture 0.17. As in the other examples of this invention, the additional longitudinal chromatic undercorrection resulting from this is trimmed to the desired amount by the color trimming elements 18e, 18e' (surfaces numbered 1 and 2, and 13 and 14 of Table VII). The radii of the convex and concave surfaces of the elements 18e and 18e' differ sufficiently so that they can not be considered "bent" plane parallel plates. Their contribution to chromatic variation of Petzval sum is in the same sense and about 0.4 the amount contributed by the menisci 16a and 16a'. They also have a small contribution to the chromatic variation of astigmatism which is opposite in sense to the residual chromatic variation of astigmatism contributed by the menisci 16a and 16a'. The chief function of the color trimming elements is the reduction of the undercorrected axial longitudinal chromatic aberration of the menisci 16a and 16a'. Although the separation of function of the two sets of meniscus elements is not as complete as in the other examples, their combined effect in the optical system is the same, i.e., the chromatic variation of focus at the center of the restricted off-axis field is balanced by having an equal and opposite variation of focus resulting from axial longitudinal chromatic aberration. Embodiments of the invention can thus take equivalent forms. Although the separation of functions of the almost concentric menisci and the color trimming elements is convenient conceptually, equivalent means of achieving the same type of color correction in restricted off-axis field systems are obvious to those skilled in the art.

As in the other examples, the convex mirrors 12b and 12b' are symmetrically located with respect to the concave mirrors 14b and 14b' at positions such that the path of a ray parallel to the optical axis from the object O is parallel to the axis at the midpoint of the system 22 and at the final image I. That is to say, in this reversible optical system the ray parallel to the axis from the object O traverses the system symmetrically. The concave and convex mirrors are then substantially concentric. The center of curvature of the convex mirrors are 3.07 millimeters from the centers of curvature of the closest concave mirrors, respectively. The departure from concentricity is thus 1.2% of the shorter (convex) radius. Since the number of systems that could be constructed along the lines of those shown in FIGS. 1 to 8 and 10 are innumerable, it is not possible to set forth an exact limit to the spacing between the centers of the concave and convex mirrors. In the systems I have investigated, however, this spacing has not exceeded three percent of the radius of the convex mirror. Table VIII is a table of the computed performance of the annular field optical system of Table VII over an extended spectral range. It is noteworthy that although the system was designed for the spectral range 240 nanometers to 365 nanometers, the degree of correction measured in wavelength units is equally excellent at 546 nanometers and beyond. This comes about because both the chromatic variation of Petzval sum and the compensating axial chromatic aberration came about as the result of the variation with wavelength of the index of refraction of a single material.

TABLE VIII

N.A. = .17 At Object and Image
RMS Wave Aberration (Wavelength Units)

| Radius of Annulus (mm.) | Wavelength (Angstrom Units) | | | | | | |
| --- | --- | --- | --- | --- | --- | --- | --- |
| | 2400 | 2600 | 2800 | 3000 | 3650 | 4358 | 5461 |
| 103 | .086 | .108 | .112 | .128 | .126 | .110 | .095 |
| 102 | .058 | .053 | .054 | .061 | .060 | .053 | .047 |
| 101 | .064 | .050 | .046 | .043 | .040 | .040 | .038 |
| 100 | .065 | .055 | .051 | .050 | .051 | .053 | .051 |
| 99 | .060 | .051 | .049 | .051 | .059 | .067 | .061 |
| 98 | .078 | .058 | .052 | .050 | .061 | .068 | .067 |
| 97 | .129 | .096 | .082 | .068 | .069 | .074 | .073 |

FIG. 10a shows an example of one means for restricting the off-axis field. While this system is illustrated for application with the embodiment of FIG. 10, it is likewise applicable to the other embodiments of the invention illustrated. As illustrated in FIG. 10a mask 28, containing a curved slit 30 of radius H is placed with its center of curvature at the optical axis SA, and in the object plane at O, as shown in FIG. 10, so as to restrict the imagery to that portion of the object area which is exposed through the slit 30. That portion of the object area will be imaged stigmatically into a similar curved area in the image plane I. This comes about because all portions of the object and image that are in the slit, or in the image of the slit, are all at substantially the same distance H from the optical axis SA, at which the system is corrected. The mask 28 could be provided in the image plane at I, or a mask could be provided in each plane, or the mask could be so positioned that the image thereof is in the image plane I. Further, when the system is used for effecting the exposure of photoresist-coated semiconductor wafers in a scanning mode, the object such as a photographic transparency is moved past the slit 30 in the direction indicated by the arrow 32 so that a substantially unit power image of that portion of the object exposed by the slit is formed at I and moves past I, in the direction indicated by arrow 34. As a result if a wafer is placed at the image I and moved synchronously with the photographic transparency, it would be exposed to an image over its entire area.

It will be particularly appreciated that with the arrangements of FIGS. 7 and 10 and with the configuration of FIG. 5, the refracting of meniscus elements 18e, 18e', 16c and 16c', respectively, can be used as windows for sealing the portions of the optical system therebetween.

It will thus be seen that the present invention does indeed provide a new and improved optical system for use in applications whose spatial relations must be reproduced with great accuracy, and which can be corrected for both a wide annulus and an extended spectral range. Although specific embodiments have been illustrated and described, it will be obvious to those skilled in the art that various modifications may be made without departing from the spirit and scope of the invention, which is to be limited solely by the appended claims.

What is claimed is:

1. In a restricted off-axis field optical system having a broad spectral range, which includes refracting means, the improvement comprising:
    said optical system being constructed and arranged so that the Petzval sum is substantially zero, and said refracting means including means for balancing the effects of the variation in said Petzval sum due to variation in color by introducing axial chromatic aberration of the opposite sense so that the position of focus at the off-axis field remains substantially constant.

2. A restricted off-axis field catadioptric optical system having a broad spectral range comprising, in combination:
    at least one convex and one concave mirror, said mirrors being nearly concentrically arranged along an optical axis; and refracting means;
    said optical system being constructed and arranged so that The Petzval sum is substantially zero, and said refracting means including means for balancing the effects of the variation in said Petzval sum due to variation in color by introducing axial chromatic aberration of the opposite sense so that the position of focus at the off-axis field remains substantially constant.

3. An optical system according to claim 1 or claim 2 wherein said restricted off-axis field is an annular field.

4. An optical system according to claim 1 or claim 2 wherein the refracting means is constructed of a single optical material.

5. An optical system according to claim 1 or claim 2 wherein said means for compensating for the variation in field curvature with color in the restricted off-axis field by introducing axial chromatic aberration of the opposite sense comprises at least one pair of symmetrically disposed nearly concentric meniscus elements whose convex radii are larger than their concave radii and whose axial thickness is greater than the difference between their convex and concave radii, respectively.

6. An optical system according to claim 1 wherein said means for compensating for the variation in field curvature with color in the restricted off-axis field by introducing axial chromatic aberration of the opposite sense comprises one pair of symmetrically disposed nearly concentric meniscus elements whose convex radii are larger than their concave radii and whose axial thickness is greater than the difference between their convex and concave radii, respectively; and color trimming means.

7. An optical system according to claim 2 wherein said means for compensating for the variation in field curvature with color in the restricted off-axis field by introducing axial chromatic aberration of the opposite sense comprises one pair of symmetrically disposed nearly concentric meniscus elements whose convex radii are larger than their concave radii and whose axial thickness is greater than the difference between their convex and concave radii, respectively; and color trimming means.

8. The optical system of claim 6 or claim 7 wherein all of the refracting elements are constructed of a single optical material.

9. The optical system according to claim 2 wherein said mirrors are arranged so that there are three reflections from said concave mirror and two reflections from said convex mirror.

10. An annular field catadioptric optical system having a broad spectral range comprising, in combination:
    at least one convex and one concave mirror, said mirrors being nearly concentrically arranged along an optical axis; and refracting means;
    said optical system being constructed and arranged so that the Petzval sum is substantially zero, and said refracting means including means for balancing the effects of the variation in said Petzval sum due to variation in color by introducing axial chromatic aberration of the opposite sense so that the position of focus at the annular field remains substantially constant;
    said means for balancing the effects of the variation in said Petzval sum due to variation in color comprising at least one pair of symmetrically disposed nearly concentric meniscus elements whose convex radii are larger than their concave radii and whose axial thickness is greater than the difference between their convex and concave radii, respectively;
    and wherein the relationship between the annular radius of the system and the characteristics of the nearly concentric meniscus lens is defined by the formula:

$$R_2 > R_1$$

and $t = R_2 - R_1 + (H^2/2N^2)(1/R_1 - 1/R_2)$ where:
- H = the annular radius of the system,
- $R_1$ = the concave radius of the meniscus lens,
- $R_2$ = the convex radius of the meniscus lens,
- t = the thickness of the meniscus lens, and
- N = the index of refraction of the meniscus lens.

11. An annular field catadioptric optical system having a broad spectral range comprising, in combination:
at least one convex and one concave mirror, said mirrors being nearly concentrically arranged along an optical axis; and refracting means;
said optical system being constructed and arranged so that the Petzval sum is substantially zero, and said refracting means including means for balancing the effects of the variation in said Petzval sum due to variation in color by introducing axial chromatic aberration of the opposite sense so that the position of focus at the annular field remains substantially constant;
said means for balancing the effects of the variation in said Petzval sum due to variation in color comprising at least one pair of symmetrically disposed nearly concentric meniscus elements whose convex radii are larger than their concave radii and whose axial thickness is greater than the difference between their convex and concave radii, respectively; and color trimming means;
and wherein the relationship between the annular radius of the system and the characteristics of the nearly concentric meniscus lens is defined by the formula:

$R_2 > R_1$ and $t > R_2 - R_1 + (H^2/2N^2)(1/R_1 - 1/R_2)$ where:
- H = the annular radius of the system,
- $R_1$ = the concave radius of the meniscus lens,
- $R_2$ = the convex radius of the meniscus lens,
- t = the thickness of the meniscus lens, and
- N = the index of refraction of the meniscus lens.

12. An annular field catadioptric optical system having a broad spectral range comprising, in combination:
at least one convex and one concave mirror, said mirrors being nearly concentrically arranged along an optical axis;
means defining a location for an object the image of which is a real image at a second location, said convex mirror being positioned to reflect to said concave mirror light from said object location initially reflected to said convex mirror from said concave mirror, whereby light from said object location will be reflected twice at said concave mirror and at least once at said convex mirror before being focused at said second location; and refracting means;
said optical system being constructed and arranged so that the Petzval sum is substantially zero, and said refracting means including means for balancing the effects of the variation in said Petzval sum due to variation in color by introducing axial chromatic aberration of the opposite sense so that the position of focus at the annular field remains substantially constant;
said means for balancing the variation in said Petzval sum due to variation in color including at least one pair of symmetrically disposed nearly concentric meniscus elements whose convex radii are larger than their concave radii and whose axial thickness is greater than the difference between their convex and concave radii, respectively; and color trimming means.

13. An annular field optical system according to claim 12 wherein said color trimming means is a substantially plane parallel plate mounted normal to the optical axis of said mirrors.

14. An annular field optical system according to claim 12 wherein said color trimming means is a plate having an aspheric surface.

15. An annular field optical system according to claim 12 wherein said color trimming means is a weak meniscus element mounted normal to the optical axis of said mirrors.

16. An annular field optical system according to claim 12 wherein said color trimming means is interposed between said mirrors and said object and image locations.

17. An annular field optical system according to claim 12 wherein said color trimming means is interposed between said meniscus elements and said mirrors.

18. An annular field optical system according to claim 15 wherein said system is characterized by the following construction data:

| SURFACE NO. FROM OBJECT TO IMAGE | RADIUS (mm.) | DISTANCE TO NEXT SURFACE (mm.) | MATERIAL | |
|---|---|---|---|---|
| 0 | (PLANE) | 144.92 | AIR | OBJECT |
| 1 | −144.96 | 11.03 | FUSED SILICA | |
| 2 | −151.75 | 88.70 | AIR | |
| 3 | −957.30 | 16.75 | FUSED SILICA | |
| 4 | −967.84 | 295.25 | AIR | |
| 5 | −551.15 | −279.07 | AIR | MIRROR |
| 6 | −267.18 | 279.07 | AIR | MIRROR |
| 7 | −551.15 | −295.25 | AIR | MIRROR |
| 8 | −967.84 | −16.75 | FUSED SILICA | |
| 9 | −957.30 | −88.70 | AIR | |
| 10 | −151.75 | −11.03 | FUSED SILICA | |
| 11 | −144.96 | −144.92 | AIR | |
| 12 | (PLANE) | | | IMAGE |

19. An annular field optical system having a broad spectral range, which includes refracting means, said optical system comprising:
a first half and a second half, each half including an optical system having an optical axis and having conjugate planes substantially normal to said axis;

the first half and the second half being coaxially disposed in back-to-back relationship so that the conjugate planes are superposed on at least one side of the optical system, and means for providing spaced object and final image locations on the other side of the optical system, said optical system being constructed and arranged so that the Petzval sum is substantially zero, and said refracting means including means for balancing the effects of the variation in said Petzval sum due to variation in color by introducing axial chromatic aberration of the opposite sense so that the positions of focus at the annular field portions of the conjugate planes remain substantially constant.

20. An annular field optical system according to claim 19 wherein said means for balancing the effects of the variation in said Petzval sum due to variation in the color includes in said first half and in said second half a symmetrically disposed nearly concentric meniscus element whose convex radius is larger than its concave radius and whose thickness is greater than the difference between its convex and concave radii.

21. An annular field optical system according to claim 20 wherein said first half and said second half each further include color trimming means.

22. An annular field optical system according to claim 21 wherein said color trimming means is a plane parallel plate mounted substantially normal to the optical axis.

23. An annular field optical system according to claim 21 wherein said color trimming means is a plate having an aspheric surface.

24. An annular field optical system according to claim 21 wherein said color trimming means is a weak meniscus element mounted normal to the optical axis.

25. An annular field optical system according to any one of claims 19, 20, 22, 23, and 24, wherein said first half and said second half each include a concave mirror and a convex mirror, said mirrors being supported with their centers of curvature substantially coincident.

26. An annular field optical system according to claim 21 wherein said first half and said second half each include a concave mirror and a convex mirror, said mirrors being supported with their centers of curvature substantially coincident.

27. An annular field optical system according to claim 21 or claim 26 wherein said means for providing spaced object and final image locations comprises folding mirrors.

28. An annular field optical system according to claim 21 or claim 26 wherein said first half and said second half are substantially symmetrical with respect to an axis in said conjugate planes.

29. An annular field optical system according to any one of claims 19, 20, 21, and 26, wherein the optical system of the first half and the optical system of the second half are each substantially unit power optical systems.

30. An annular field optical system according to claim 26 wherein said meniscus elements are interposed between said mirrors and said object and final image locations, respectively.

31. An annular field optical system according to claim 26 wherein said meniscus elements are interposed between said mirrors and said intermediate image location, respectively.

32. An annular field optical system according to claim 26 wherein said color trimming means includes two elements which are interposed between said mirrors and said intermediate image location, respectively.

33. An annular field optical system according to claim 26 wherein said color trimming means includes two elements which are interposed between said mirrors and said object and final image locations, respectively.

34. An annular field optical system according to claim 26 wherein said color trimming means is a single element disposed at said intermediate image location.

35. An annular field optical system according to claim 19 wherein each half includes a concave mirror and a convex mirror facing said concave mirror and a convex mirror facing said concave mirror, said mirrors being substantially concentrically arranged along said axis;

and wherein on the other side of the optical system the distance from the conjugate location to the two mirror component is different from the distance to the intermediate image location in at least one half, to thereby provide the spaced object and final image locations.

36. An annular field optical system according to claim 35 wherein said means for balancing the effects of the variation in said Petzval sum due to variation in color includes in said first half and in said second half a nearly concentric meniscus element whose convex radius is larger than its concave radius and whose thickness is greater than the difference between its convex and concave radii.

37. An annular field optical system according to claim 36 wherein said meniscus elements are interposed between said mirrors and said object and final image locations, respectively.

38. An annular field optical system according to claim 36 wherein said meniscus elements are interposed between said mirrors and said intermediate image location, respectively.

39. An annular field optical system according to claim 36 or claim 37 or claim 38 wherein said optical system further includes a color trimming element disposed substantially at said intermediate image location.

40. An annular field optical system according to claim 36 or claim 37 or claim 38 wherein said optical system further includes a plane parallel plate mounted substantially normal to the optical axis and substantially at said intermediate image location.

41. An annular field optical system according to claim 36 or claim 37 or claim 38 wherein said optical system further includes a plane parallel plate mounted substantially normal to the optical axis and substantially at said intermediate image location and wherein one of the faces of said plane parallel plate is made aspheric.

42. An annular field optical system according to claim 36 or claim 37 or claim 38 wherein said optical system further includes a weak meniscus element, mounted normal to the optical axis of said mirrors and substantially at said intermediate image location.

43. An annular field optical system according to any one of claims 35 to 38 wherein said first half and said second half are substantially symmetrical with respect to an axis through the intermediate image location.

44. An annular field optical system according to claim 19 wherein each half includes a concave mirror and a convex mirror facing said concave mirror, said mirrors being substantially concentrically arranged along an optical axis;

and wherein the distance from the intermediate image to the two mirror component is greater than the distance from the other conjugate location to the two mirror component in at least one half to thereby space said object and final image locations one from the other, said means for balancing the effects of the variation in said Petzval sum due to variation in color includes in said first half and in said second half a meniscus element interposed between said mirrors and said intermediate image location, said meniscus element being nearly concentric but having a difference between the radii of its meniscus surfaces of less than its thickness so that it is not exactly concentric while its power is negative, and a color trimming element disposed substantially at said intermediate image location, said element being normal to the optical axis of said mirrors.

45. An annular field optical system according to claim 44 wherein said system is characterized by the following construction data:

| SURFACE NO FROM OBJECT TO IMAGE | RADIUS (mm.) | DISTANCE TO NEXT SURFACE (mm.) | MATERIAL | |
|---|---|---|---|---|
| 0 | (PLANE) | 107.13 | AIR | OBJECT |
| 1 | −128.18 | 10.48 | FUSED SILICA | |
| 2 | −135.29 | 378.48 | AIR | |
| 3 | −541.32 | −273.56 | AIR | MIRROR |
| 4 | −264.61 | 273.56 | AIR | MIRROR |
| 5 | −541.32 | −590.28 | AIR | MIRROR |
| 6 | −1772.58* | −7.01 | FUSED SILICA | ASPHERIC |
| 7 | (PLANE) | −587.26 | AIR | |
| 8 | 541.32 | 273.56 | AIR | MIRROR |
| 9 | 264.61 | −273.56 | AIR | MIRROR |
| 10 | 541.32 | 378.48 | AIR | MIRROR |
| 11 | 135.29 | 10.48 | FUSED SILICA | |
| 12 | 128.18 | 107.13 | AIR | |
| 13 | (PLANE) | | | IMAGE |

*ASPHERIC SURFACE SYMMETRICAL ABOUT OPTICAL AXIS, and the RADIUS OF ANNULUS = 100 mm. and the DEPARTURE, X, FROM PLANE SURFACE AT DISTANCE r FROM AXIS.
$X = -1772.58 + \sqrt{1772.58^2 - r^2} + 1.732 \times 10^{-8} r^4 + 4.210 \times 10^{-13} r^6 + 8.278 \times 10^{-18} r^8 - 4.078 \times 10^{-21} r^{10}$.

46. An annular field optical system according to claim 19 wherein said intermediate image location is axially displaced from the other conjugate plane in at least one half so that said final image location and said object location are crossed, and reflecting means interposed between the object and final image locations to reposition said locations to make them physically accessible.

47. An annular field optical system according to claim 46 wherein said first half and said second half each include a concave mirror and a convex mirror facing said concave mirror.

48. An annular field optical system according to claim 47 wherein said means for balancing the effects of the variation in said Petzval sum due to variation in color includes in said first half and in said second half a nearly concentric meniscus element whose convex radius is larger than its concave radius and whose thickness is greater than the difference between its convex and concave radii.

49. An annular field optical system according to claim 48 wherein said meniscus elements are interposed between said mirrors and said intermediate image location, respectively.

50. An annular field optical system according to claim 49 wherein said optical system further includes a color trimming element disposed substantially at said intermediate image location.

51. An annular field optical system according to claim 49 wherein said first half and said second half each further include a color trimming element.

52. An annular field optical system according to claim 49 wherein said first half and said second half each have a color trimming element interposed between said mirrors and said object and final image locations respectively, said element being normal to the optical axis of said mirrors.

53. An annular field optical system according to claim 52 wherein one of the faces of said color trimming element is made aspheric.

54. An annular field optical system according to claim 47 wherein in each half of the system, said concave and convex mirrors are supported with a distance between their centers of curvature of less than about three percent of the length of the shorter radius.

55. An annular field optical system according to claim 52 wherein said first half and said second half are substantially symmetrical with respect to an axis through the intermediate image location.

56. An annular field optical system according to claim 52 wherein said system is characterized by the following construction data:

| SURFACE NO. FROM OBJECT TO IMAGE | RADIUS (mm.) | DISTANCE TO NEXT SURFACE (mm.) | MATERIAL | |
|---|---|---|---|---|
| 0 | (PLANE) | 151.33 | AIR | OBJECT |
| 1 | −726.89 | 28.69 | FUSED SILICA | |
| 2 | −730.32 | 410.82 | AIR | |
| 3 | −552.06 | −280.16 | AIR | MIRROR |
| 4 | −267.18 | 280.16 | AIR | MIRROR |
| 5 | −552.06 | −363.25 | AIR | MIRROR |
| 6 | −160.78 | 24.03 | FUSED SILICA | |
| 7 | −145.19 | −272.77 | AIR | |

-continued

| SURFACE NO. FROM OBJECT TO IMAGE | RADIUS (mm.) | DISTANCE TO NEXT SURFACE (mm.) | MATERIAL | |
|---|---|---|---|---|
| 8 | 145.19 | −24.03 | FUSED SILICA | |
| 9 | 160.78 | −363.25 | AIR | |
| 10 | 552.06 | 280.16 | AIR | MIRROR |
| 11 | 267.18 | −280.16 | AIR | MIRROR |
| 12 | 552.06 | 410.82 | AIR | MIRROR |
| 13 | 730.32 | 28.69 | FUSED SILICA | |
| 14 | 726.89 | 151.33 | AIR | |
| 15 | (PLANE) | | | IMAGE | and RADIUS OF ANNULUS = 100 mm.

57. An annular field optical system according to claim 19 wherein each half includes a concave mirror and a convex mirror facing said concave mirror, said mirrors being supported with their centers of curvature substantially coincident;

and wherein the distance from the intermediate image to the two mirror component is greater than the distance from the other conjugate location to the two mirror component in at least one half, to thereby space said object and final image locations one from the other, said means for balancing the effects of the variation in said Petzval sum due to variation in color includes in said first half and in said second half a meniscus element interposed between said mirrors and said intermediate image location, said meniscus element being symmetrically disposed and nearly concentric having a convex radius larger than its concave radius and a thickness greater than the difference between its convex and concave radii.

58. An annular field optical system according to claim 57 wherein said first half and said second half each have a color trimming element interposed between said mirrors and said object and final image locations repectively, said element being normal to the optical axis of said mirrors.

59. An annular field optical system according to claim 58 wherein one of the faces of said color trimming element is aspheric.

60. An annular field optical system according to claim 58 wherein said color trimming element is a meniscus element.

61. An annular field optical system according to claim 58 wherein, in each half of the system, said concave and convex mirrors are supported with a distance between their centers of curvature of less than about three percent of the length of the shorter radius.

62. An annular field optical system according to claim 58 wherein said first half and said second half are substantially symmetrical with respect to an axis through the intermediate image location.

63. An annular field optical system according to claim 58 wherein said system is characterized by the following construction data:

| | RADIUS OF ANNULUS = 100 mm. | | | |
|---|---|---|---|---|
| SURFACE NO | RADIUS (mm.) | DISTANCE TO NEXT SURFACE (mm.) | MATERIAL | NOTE |
| 0 | (PLANE) | 88.41 | AIR | OBJECT |
| 1 | −212.36 | 8.37 | FUSED SILICA | |
| 2 | −217.77 | 394.30 | AIR | |
| 3 | −539.26 | −271.74 | AIR | MIRROR |
| 4 | −264.45 | 271.74 | AIR | MIRROR |
| 5 | −539.26 | −476.12 | AIR | MIRROR |
| 6 | −128.55 | −6.68 | FUSED SILICA | |
| 7 | −123.91 | −220.54 | AIR | |
| 8 | 123.91 | −6.68 | FUSED SILICA | |
| 9 | 128.55 | −476.12 | AIR | |
| 10 | 539.26 | 271.74 | AIR | MIRROR |
| 11 | 264.45 | −271.74 | AIR | MIRROR |
| 12 | 539.26 | 394.30 | AIR | MIRROR |
| 13 | 217.77 | 8.37 | FUSED SILICA | |
| 14 | 212.36 | 88.41 | AIR | |
| 15 | (PLANE) | | | IMAGE |

64. An annular field catadioptric optical system comprising:
at least one concave and one convex mirror arranged around an optical axis in face-to-face relationship with their centers of curvature being substantially concentric and falling on said axis, the convex mirror being smaller than and having a smaller radius of curvature than the concave mirror;
means defining an object location and a conjugate real image location, said convex mirror being positioned to reflect to said concave mirror light from said object location initially reflected from said concave mirror whereby light from said object location will be reflected at least twice at said concave mirror and at least once at said convex mirror before being focused at the image location;
means for limiting the image field to an annular zone centered about the optical axis; and
refracting means positioned in the light path between the object and image locations, said refracting means including means to reduce the spherical aberration of principal rays parallel to the optical axis, and means to introduce axial chromatic aberration of the opposite sense to balance out in said annular zone variations in focus resulting from curvature due to variations in wavelength.

65. The system of claim 64 wherein the entirety of said refracting means is made from the same optical material.

66. The system of claim 64 or 65 further provided with color trimming means to maximize aberration reduction in said annular zone.

* * * * *